United States Patent
Song et al.

(10) Patent No.: US 9,438,002 B2
(45) Date of Patent: Sep. 6, 2016

(54) LASER SYSTEM

(71) Applicant: Electronics and Telecommunications Research Institute, Daejeon (KR)

(72) Inventors: Dong Hoon Song, Daejeon (KR); Mun Youn Jung, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 0 days.

(21) Appl. No.: 14/607,002

(22) Filed: Jan. 27, 2015

(65) Prior Publication Data

US 2015/0214688 A1    Jul. 30, 2015

(30) Foreign Application Priority Data

Jan. 29, 2014  (KR) .................. 10-2014-0011009
Apr. 3, 2014   (KR) .................. 10-2014-0039958

(51) Int. Cl.
*H01S 3/10*   (2006.01)
*H01S 3/00*   (2006.01)
*H01S 5/00*   (2006.01)

(52) U.S. Cl.
CPC ............ *H01S 3/0057* (2013.01); *H01S 5/0092* (2013.01)

(58) Field of Classification Search
CPC .............................. H01S 3/005; H01S 3/0057
See application file for complete search history.

(56) References Cited

U.S. PATENT DOCUMENTS

| | | | |
|---|---|---|---|
| 7,165,851 B2* | 1/2007 | Matsuda | G02B 26/002 359/238 |
| 2003/0002097 A1* | 1/2003 | Morbieu | G02B 5/32 359/15 |
| 2004/0190119 A1* | 9/2004 | Tauser | H01S 3/0057 359/333 |
| 2009/0161202 A1* | 6/2009 | Kong | G02F 1/39 359/345 |
| 2011/0026105 A1* | 2/2011 | Bayramian | H01S 3/0057 359/337.5 |
| 2013/0299706 A1 | 11/2013 | Jung et al. | |

FOREIGN PATENT DOCUMENTS

JP   2003311457   * 11/2003

OTHER PUBLICATIONS

Alfano, "Observation of Self-Phase Modulation and Small Scale Filaments in Crystals and Glasses", Mar. 1970, Phys Rev Lett, vol. 24, No. 11, pp. 592-594.*
Alfano (editor), "The Supercontinuum Laser Source," 2006, Springer, Second Edition, pp. 1-20.*
Kane "Grism-pair stretcher compressor system for simultaneous second- and third-order dispersion compensation in chirped pulse amplification," Mar. 1997, Opt. Soc. Am. B, vol. 14, No. 3, pp. 661-665.*
Donna Strickland et al., "Compression of Amplified Chirped Optical Pulses," Optics Communications, Dec. 1, 1985, pp. 219-221, vol. 56, No. 3.

(Continued)

*Primary Examiner* — Yuanda Zhang
*Assistant Examiner* — Michael Carter

(57) ABSTRACT

Provided is a laser system. The laser system includes: a laser device providing a laser pulse; a pulse compressor decreasing a pulse width of the laser pulse; a pulse stretcher disposed between the compressor and the laser device and dispersing the laser pulse; and a filament portion disposed between the pulse stretcher and the pulse compressor, wherein the filament portion transmits the laser pulse to expand a spectrum of the laser pulse by using self focusing and a filament phenomenon of the laser pulse.

18 Claims, 6 Drawing Sheets

(56) References Cited

OTHER PUBLICATIONS

D. E. Spence et al., "60-fsec pulse generation from a self-mode-locked Ti:sapphire Laser," Optics Letters, Jan. 1, 1991, pp. 42-44, vol. 16, No. 1.

C.V.Shank et al., "Subpicosecond kilowatt pulses from a modelocked cw dye laser," Applied Physics Letters, Apr. 15, 1974, pp. 373-375, vol. 24, No. 8.

A. J. Demaria et al., "Self Mode-Locking of Lasers With Saturable Absorbers", Applied Physics Letters, Apr. 1, 1966, pp. 174-176, vol. 8, No. 7.

* cited by examiner

LASER SYSTEM

CROSS-REFERENCE TO RELATED APPLICATIONS

This U.S. non-provisional patent application claims priority under 35 U.S.C. §119 of Korean Patent Application Nos. 10-2014-0011009, filed on Jan. 29, 2014, and 10-2014-0039958, filed on Apr. 3, 2014, the entire contents of which are hereby incorporated by reference.

BACKGROUND OF THE INVENTION

The present invention disclosed herein relates to an optical device, and more particularly, to a laser system that may expand the spectrum of a laser pulse and increase peak intensity thereof.

After the invention of the laser in the 1960s, research on industrial applications of the laser actively began in the 1970s. Actually, a laser including a $CO_2$ laser has been utilized for various fields such as industry, medical treatment, communication, and display since 1980.

Also, a solid-state laser has emerged due to the development of a diode laser in 1980's and as the solid-state laser is applied to a field to which a typical gas-state laser is easily applied, a demand for the laser has gradually increased. Thus, laser application fields are becoming very broad, such as an industry field including laser processing, cutting, welding, drilling, trimming, and etching fields, a medical field including dental treatment, spot, tattoo removal, hair removal, laser-assisted in-situ keratomileusis (LASIK), an academic field studying on the interaction of a laser and a material, national defense and culture fields.

The development of an industrial technology needs precision and high productivity in the field in which a laser is used. In response thereto, an ultra-short laser beam is being utilized in various fields, recently. The ultra-short laser beam is generally called a femto second or pico second laser beam.

The ultra-short laser beam has a characteristic that optical energy is focused for a very short time, e.g., about $10^{-12}$ s to about $10^{-15}$ s to emit light. Thus, the ultra-short laser beam shows a different characteristic from a typical laser beam. For example, since the ultra-short laser beam is irradiated for a shorter time than a time for which heat is transferred to a medium when the beam is irradiated to the medium, it is possible to avoid thermal effect or thermal deformation that appears in typical laser processing.

Since the ultra-short laser beam may process a medium without damage to the surface of the medium, it is being used in fields (semiconductor, electronic chips, and medical treatment) that need precise and micro processing.

However, the ultra-short laser alone has a limitation in intensity in order to be industrially used for the increase in yield and the expansion of a processing area. Thus, it works as a constraint on the expansion of application fields.

A pico second laser beam has been proposed by A. J. DeMaria, D. A. Stetser, and H. Heynau in 1966. The pico second laser beam may be provided through a pico second Nd:glass laser that uses a dye as saturable absorber. A femto second laser beam has been proposed by C. V. Shank and E. P. Ipen in 1974. The femto second laser beam may be generated by using a dye as a gain material. Then, with the emergence of a diode laser, a femto second solid-state laser that uses a mode locking technology has been introduced by D. E. Spence, et al. in 1991. Also, a high-intensity pico second laser using the mode locking technology or saturable absorber has also developed. Also, the ultra-short laser pulse has combined with a chirped pulse amplification (CPA) technology developed by G. Mourou, et al. in 1985 and thus the amplification of the ultra-short laser pulse has become possible, and at present, a high-intensity ultra-short pulse emitted through a multiple amplification stages is being used in many fields. However, since due to the amplification stage, the size of a laser grows, the cost also increases and a specialist for maintaining the amplification stage is needed, there is a constraint on the expansion of an application in the industrial world.

SUMMARY OF THE INVENTION

The present invention provides a laser system that may expand the spectrum of a laser pulse.

The present invention also provides a laser system that may maximize the peak intensity of a laser pulse.

Embodiments of the present invention provide laser systems including: a laser device providing a laser pulse; a pulse compressor decreasing a pulse width of the laser pulse; a pulse stretcher disposed between the compressor and the laser device and dispersing the laser pulse; and a filament portion disposed between the pulse stretcher and the pulse compressor, wherein the filament portion transmits the laser pulse to expand a spectrum of the laser pulse by using self focusing and a filament phenomenon of the laser pulse.

In some embodiments, the filament portion may include transparent glass having a lower energy band gap than quartz. The filament portion may have an about 3.3 eV energy band gap.

In other embodiments, the laser system may further include: a first lens disposed between the pulse stretcher and the filament portion and focusing the laser pulse on the filament portion; and a second lens disposed between the filament portion and the pulse compressor and providing the laser pulse in parallel to the pulse compressor.

In still other embodiments, the pulse stretcher and the pulse compressor may include a chirped pulse stretcher and a chirped pulse compressor, respectively. The chirped pulse stretcher may include: a first chirped mirror reflecting the laser pulse; and a second chirped mirror disposed in parallel to the first chirped mirror, wherein the second chirped mirror reflects the laser pulse reflected from the first chirped mirror to disperse the laser pulse with a negative dispersion. The chirped pulse compressor may include: a third chirped mirror reflecting the laser pulse; and a fourth chirped mirror disposed in parallel to the third chirped mirror, wherein the fourth chirped mirror reflects the laser pulse reflected from the third chirped mirror to decrease the pulse width of the laser pulse.

In even other embodiments, the pulse stretcher and the pulse compressor may include a prism stretcher and a prism compressor, respectively. The prism stretcher may include: a first half mirror transmitting the laser pulse; a first prism refracting the laser pulse passing through the first half mirror; a second prism disposed to diagonally face the first prism, wherein the second prism refracts the laser pulse refracted from the first prism to disperse the laser pulse with the negative dispersion; and a first mirror reflecting, the laser pulse provided from the second prism, back to the second prism. The prism compressor may include: a second half mirror transmitting the laser pulse; a third prism refracting the laser pulse passing through the second half mirror; a fourth prism disposed to diagonally face the third prism, wherein the fourth prism refracts the laser pulse refracted from the third prism to decrease a pulse width of the laser pulse; and a second mirror reflecting, the laser pulse refracted from the fourth prism, back to the fourth prism. The laser system may further include: a third mirror between the prism stretcher and the filament portion; a target exposed to a laser pulse provided from the prism compressor; and a fourth mirror between the prism compressor and the target.

In yet other embodiments, the pulse stretcher and the pulse compressor may include a grating-based stretcher and a grating-based compressor, respectively. The grating-based stretcher may include: a third half mirror transmitting the laser pulse; a first grating reflecting the laser pulse passing through the third half mirror; a second grating disposed in parallel to the first grating, wherein the second grating reflects the laser pulse reflected from the first grating to disperse the laser pulse with the negative dispersion; and a fifth mirror reflecting, the laser pulse reflected from the second grating, back to the second grating. The grating-based compressor may include: a fourth half mirror transmitting the laser pulse; a third grating reflecting the laser pulse passing through the fourth half mirror; a fourth grating disposed in parallel to the third grating, wherein the fourth grating reflects the laser pulse reflected from the third grating to decrease a pulse width of the laser pulse; and a sixth mirror reflecting, the laser pulse reflected from the fourth grating, back to the fourth grating. The laser system may further include: a seventh mirror between the grating-based stretcher and the filament portion; a target exposed to a laser pulse provided from the grating-based compressor; and an eighth mirror between the grating-based compressor and the target.

In further embodiments, the pulse stretcher and the pulse compressor may include a grism stretcher and a grism compressor, respectively. The grism stretcher may include: a fifth half mirror transmitting the laser pulse; a first grism refracting the laser pulse passing through the fifth half mirror; a second grism disposed to diagonally face the first grism, wherein the second grism refracts the laser pulse refracted from the first grism to disperse the laser pulse with the negative dispersion; and a ninth mirror reflecting, the laser pulse refracted from the second grism, back to the second grism. The grism compressor may include: a sixth half mirror transmitting the laser pulse; a third grism refracting the laser pulse passing through the sixth half mirror; a fourth grism disposed to diagonally face the fourth grism, wherein the fourth grism refracts the laser pulse refracted from the third grism to decrease a pulse width of the laser pulse; and a tenth mirror reflecting, the laser pulse refracted from the fourth grism, to the fourth grism. The laser system may further include: an eleventh mirror between the grism stretcher and the filament portion; a target exposed to a laser pulse provided from the grism compressor; and a twelfth mirror between the grism compressor and the target.

In other embodiments of the present invention, laser systems include: a laser device providing a laser pulse; a pulse stretcher dispersing the laser pulse with a negative group delay dispersion; and a filament portion transmitting the laser pulse to offset the negative group delay dispersion by positive group delay dispersion to expand a spectrum of the laser pulse by using self focusing and a filament phenomenon of the laser pulse.

BRIEF DESCRIPTION OF THE DRAWINGS

The accompanying drawings are included to provide a further understanding of the present invention, and are incorporated in and constitute a part of this specification. The drawings illustrate exemplary embodiments of the present invention and, together with the description, serve to explain principles of the present invention. In the drawings.

DETAILED DESCRIPTION OF PREFERRED EMBODIMENTS

Figure 1:
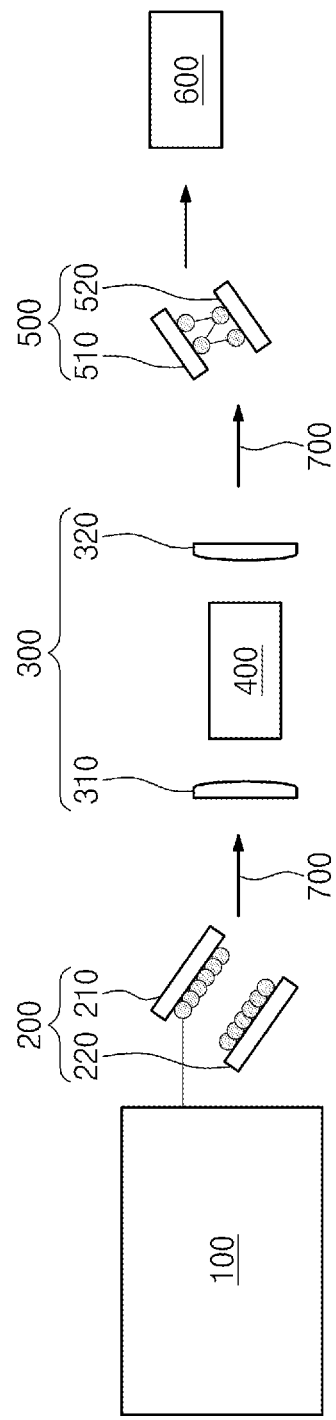
FIG. 1 represents a laser system according to a first embodiment of the present invention.

Exemplary embodiments of the present invention are described below in detail with reference to the accompanying drawings. The effects and features of the present invention, and implementation methods thereof will be clarified through following embodiments described to be described in detail with reference to the accompanying drawings. However, the present invention is not limited to embodiments to be described below but may also be implemented in other forms. Rather, these embodiments are provided so that this disclosure can be thorough and complete and fully convey the scope of the present invention to a person skilled in the art, and the present invention is only defined by scopes of claims. The same reference numerals throughout the disclosure refer to the same components.

The terms used herein are only for explaining embodiments and not intended to limit the present invention. The terms in a singular form in the disclosure may also include plural forms unless otherwise specified. The terms used herein "comprises" and/or "comprising" do not exclude the presence or addition of one or more additional components, steps, operations and/or elements other than the components, steps, operations and/or elements that are mentioned. Also, a laser pulse and a laser beam that are used herein equally mean light, and a spectrum, pulse width, parallel beam and beam size may be understood as general optical terms related to the wavelength, intensity, and dose of the laser pulse. Since the following description presents an exemplary embodiment, the reference numerals presented according to the order of the description are not limited to the order.

FIG. 1 is a schematic view of a laser system according to a first embodiment of the present invention. A laser system may include a laser device 100, a pulse stretcher 200, lens 300, a filament portion 400, a pulse compressor 500, and a target 600.

The laser device 100 may generate a laser pulse 700. The laser device 100 may provide the laser pulse 700 to the pulse stretcher 200. For example, the laser device 100 may be an oscillator. The laser pulse 700 may be an ultra-short wavelength high-intensity energy beam. The laser pulse may have a pulse width of about several femto seconds to about several hundreds of femto seconds. Also, the laser pulse 700 may be a non-amplification laser beam having a MHz repetition rate and micro joule pulse energy.

The pulse stretcher 200 may expand the laser pulse 700 in a time scale direction. In particular, the pulse stretcher 200 may disperse the laser pulse 700 with a negative group delay dispersion. As an example, the pulse stretcher 200 may be a down-chirped pulse stretcher. The pulse stretcher 200 may include a first chirped mirror 210 and a second chirped mirror 220. The first chirped mirror 210 and the second chirped mirror 220 may face each other and be parallel to each other. The laser pulse 700 may sequentially pass through the first chirped mirror 210 and the second chirped mirror 220. The first chirped mirror 210 may reflect the laser pulse 700 to the second chirped mirror 220. The second chirped mirror 220 may reflect the laser pulse 700 back to the first chirped mirror 210. The second chirped mirror 220 may disperse the laser pulse 700 the negative group delay dispersion.

The lens 300 may focus the laser pulse 700 on the filament portion 400. As an example, the lens 300 may include a first lens 310 and a second lens 320. The first lens 310 may be disposed between the pulse stretcher 200 and the filament portion 400. The first lens 310 may focus the laser pulse 700 on the filament portion 400. The second lens 320 may be disposed between the filament portion 400 and the pulse compressor 500. The second lens 320 may provide the laser pulse 700 being a parallel beam to the pulse compressor 500. That is, the second lens 320 may collimate the laser pulse 700.

The filament portion 400 may expand the spectrum of the laser pulse 700. The laser pulse 700 may pass through the filament portion 400. The filament portion 400 may be formed of transparent glass. In general, the transparent glass has an energy band gap having various sizes ranging from several eV to several tens of eV. As an example, the filament portion 400 may have an energy band gap lower than quartz. The quartz may have an energy band gap of about 8 eV or higher. For example, the filament portion 400 may include N-SF11 having an energy band gap of about 3.3 eV.

The filament portion 400 may induce the filament phenomenon and self-focusing of the laser pulse 700. The filament phenomenon indicates a phenomenon that involves a self-phase modulation effect and expands the spectrum of the laser pulse 700. The self focusing is a phenomenon that spontaneously decreases the beam size of the laser pulse 700 in the filament portion 400. In this case, there is a peak intensity threshold value of the laser pulse 700 self-focused according to the size of the energy band gap of the filament portion 400. The laser pulse 700 lower than the peak intensity threshold value of the filament portion 400 may not be self-focused in the filament portion 400 and the laser pulse 700 higher than the threshold value may be self-focused. Thus, as the energy band gap of the filament portion 400 decreases, the low peak intensity of the laser pulse 700 is needed. However, when the laser pulse 700 has a MHz repetition rate, the self phase modulation phenomenon may be involved, inducing self focusing by way of exception, even in the case of intensity lower than a peak intensity threshold value. It is possible to restrict the expansion range of the spectrum of the laser pulse 700. The spectrum of the laser pulse 700 may be expanded to some extent. Most of high-intensity ultra-short laser pulses 700 may be self-focused in the transparent glass having a lower energy band gap than quartz. The filament portion 400 having the energy band gap lower than quartz may minimize a constraint or margin on peak intensity of the laser pulse 700. The filament portion 400 may widen the options of the laser device 100.

In addition to an expensive high-intensity laser device 100, it is possible to use an inexpensive low-intensity laser device 100.

On the contrary, the filament portion 400 having a relatively high energy band gap may need the high peak intensity of the laser pulse 700. That is, the filament portion 400 may self-focus a high peak intensity laser pulse when there is a high peak intensity threshold value. In addition, a wide spectrum of the laser pulse 700 may be obtained. Nevertheless, the filament portion 400 may increase a constrain or margin on the peak intensity of the laser pulse 700. The filament portion 400 having a high energy band gap may be appropriately used for the high intensity laser device 100.

The filament portion 400 may provide the laser pulse 700 having positive group delay dispersion. The filament portion 400 may offset the negative group delay dispersion of the laser pulse 700 by the positive group delay dispersion. When the laser pulse 700 having the negative group delay dispersion is provided to the filament portion 400, the dispersion of the laser pulse 700 may be mutually offset and the peak intensity of the laser pulse 700 may be maximized. The reason is because the laser pulse 700 obtains a maximum self phase modulation effect and the spectrum of the laser pulse 700 is further expanded.

Figure 2:
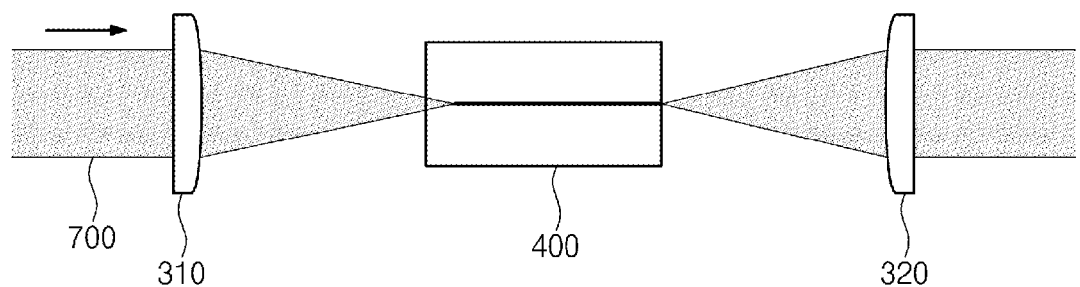
FIG. 2 represents a laser pulse in a filament portion in FIG. 1.

FIG. 2 shows the laser pulse 700 in the filament portion 400 in FIG. 1. The laser pulse 700 may be self-focused in the filament portion 400 to have a filament shape.

Figure 3:
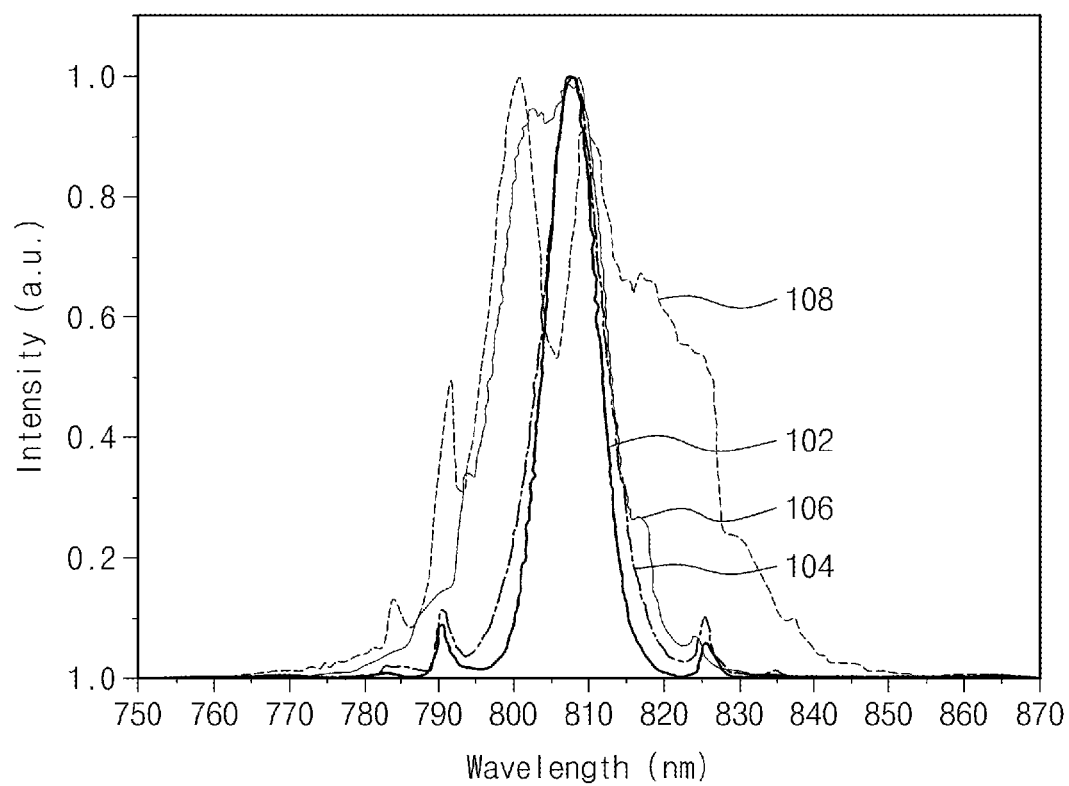
FIG. 3 represents graphs of a source spectrum, a first normal dispersion spectrum, a second normal dispersion spectrum, and an abnormal dispersion spectrum.

FIG. 3 shows a source spectrum 102, a first normal dispersion spectrum 104, a second normal dispersion spectrum 106, and an abnormal dispersion spectrum 108. The source spectrum 102 is a spectrum of the laser pulse 700 provided by the laser device 100. The first normal dispersion spectrum 104 is a spectrum of the laser pulse 700 passing through the filament portion 400 having a thickness of about 2.7 mm. The second normal dispersion spectrum 106 is a spectrum of the laser pulse 700 passing through the filament portion 400 having a thickness of about 10 mm. The abnormal dispersion spectrum 108 is a spectrum of the laser pulse 700 that the laser pulse 700 having the negative group delay dispersion passes through the filament portion 400 having a thickness of about 10 mm. In this example, the negative group delay dispersion is about −2760 fs$^2$. The abnormal dispersion spectrum 108 may have intensity corresponding to a wider wavelength range than the source spectrum 102, the first normal dispersion spectrum 104, and the second normal dispersion spectrum 106. Through the comparison of the first normal dispersion spectrum 104 with the second normal dispersion spectrum 106, the expansion of a spectrum may be adjusted according to the thickness of the filament portion 400.

Referring back to FIG. 1, the laser pulse 700 may be propagated from the filament portion 400 to the pulse compressor 500. The pulse compressor 500 may temporally compress the laser pulse 700. That is, the pulse compressor 500 may decrease the width of the laser pulse 700. The pulse compressor 500 may have a structure similar to that of the pulse stretcher 200. As an example, the pulse compressor 500 may be a down-chirped pulse compressor. The pulse compressor 500 may be synchronized with the pulse stretcher 200 at the same frequency. The pulse compressor 500 may include a third chirped mirror 510 and a fourth chirped mirror 520. The third chirped mirror 510 and the fourth chirped mirror 520 may be disposed to face each other and be parallel to each other. The laser pulse 700 may sequentially pass through the third chirped mirror 510 and the fourth chirped mirror 520. The third chirped mirror 510 may reflect the laser pulse 700 to the fourth chirped mirror

520. The fourth chirped mirror 520 may reflect the laser pulse 700 to the target 600. The fourth chirped mirror 520 may decrease the width of the laser pulse 700.

The target 600 may be disposed behind the pulse compressor 500. The target 600 may include a detector. The detector may detect the peak intensity of the laser pulse 700. The detector may include a spectrometer or auto-correlator.

Figure 4:
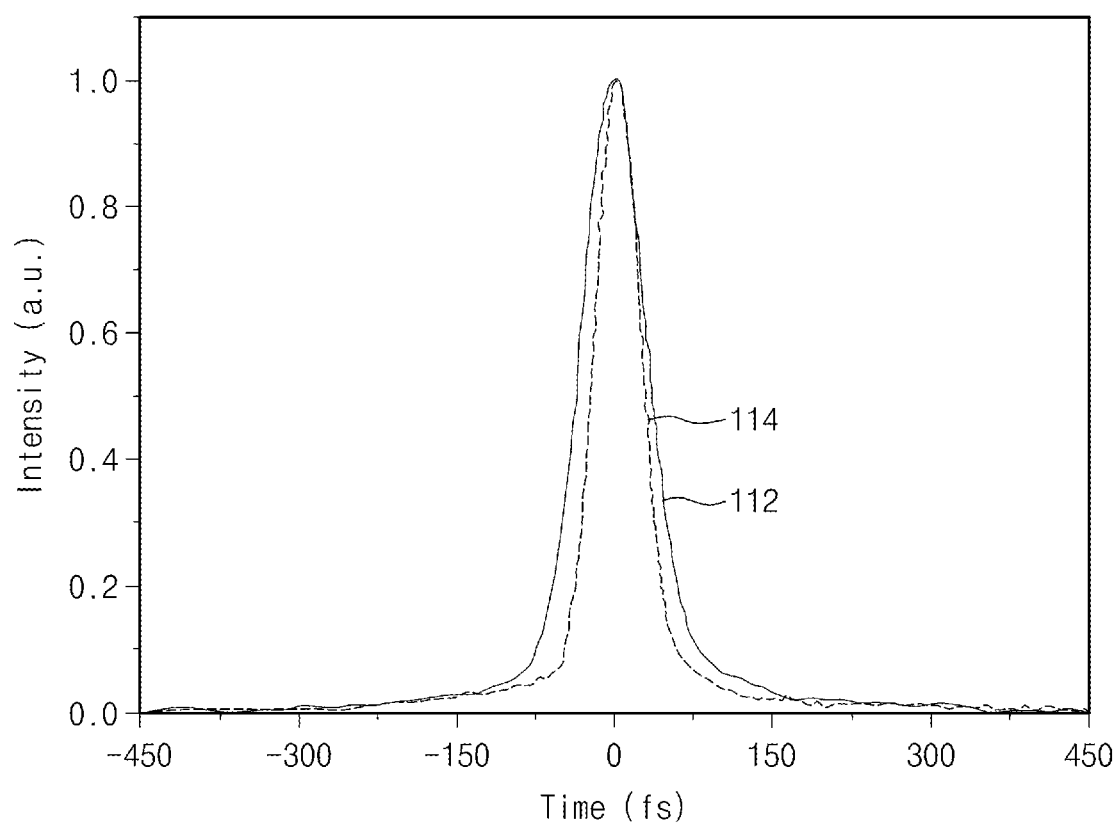
FIG. 4 represents graphs of the second normal dispersion spectrum and the abnormal dispersion spectrum in FIG. 3 having a first pulse width and a second pulse width obtained by passing the laser pulses of the spectrums through a pulse compressor.

FIG. 4 shows a first spectrum 112 and a second spectrum 114 that are formed after the laser pulses of the second normal dispersion spectrum 106 and the abnormal dispersion spectrum 108 in FIG. 3 pass through the pulse compressor 500. The pulse width of the first spectrum 112 is about 47 femtosecond (fs) and the pulse width of the second spectrum 114 is about 33 femtosecond (fs). As the spectrum of the laser pulse 700 in the filament portion 400 becomes wide, the pulse width of the spectrum of the laser pulse 700 compressed by the pulse compressor 500 may become narrow. In this example, the pulse width may be defined as a time interval at which amplitude becomes half at the rise and fall times of a pulse. When the higher order dispersion of the laser pulse 700 of the abnormal dispersion spectrum 108 is adjusted to zero, the pulse width of the second spectrum 114 may decrease to about 31 femtosecond (fs). The peak intensity of the laser pulse 700 having a narrow pulse width may be stronger than the peak intensity of the laser pulse 700 having a wide pulse width. Thus, the laser system according to the first embodiment of the present invention may maximize the peak intensity of the laser pulse 700.

Figure 5:
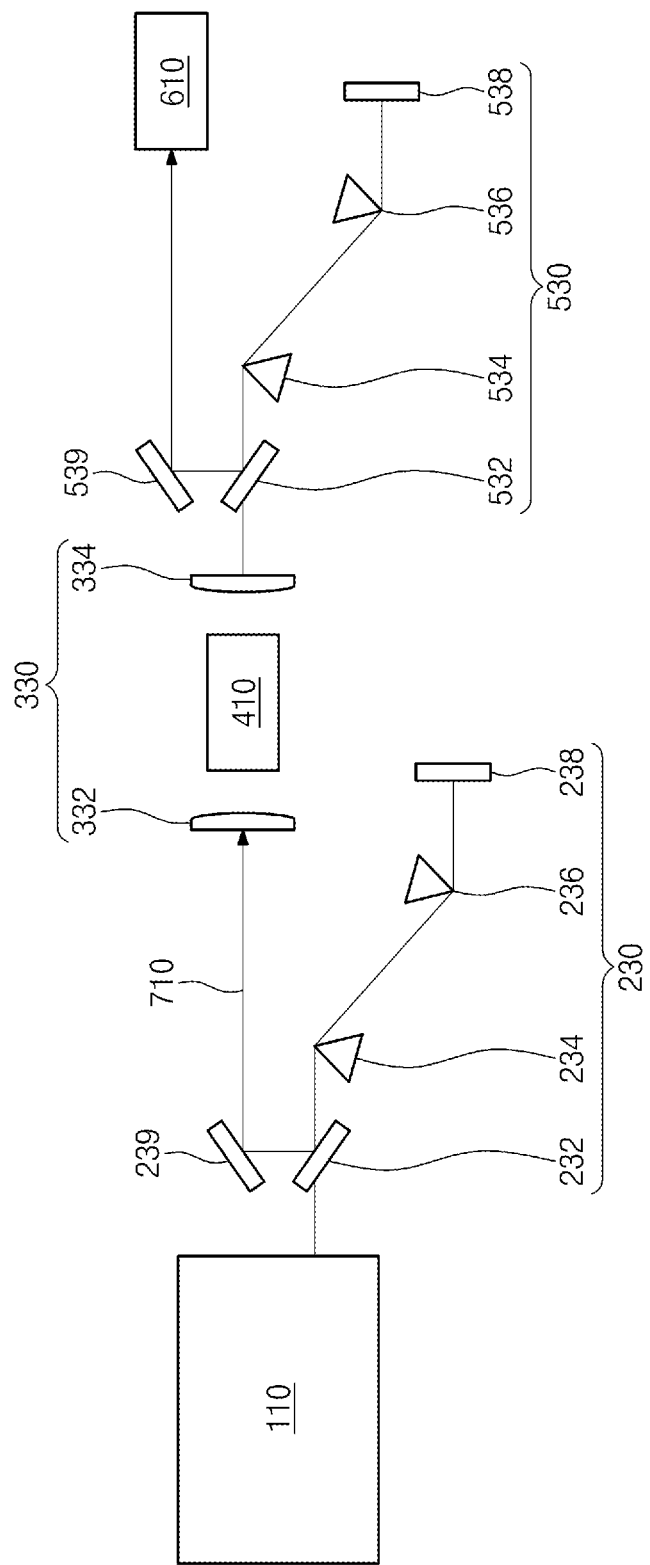
FIG. 5 represents a laser system according to a second embodiment of the present invention.

FIG. 5 shows a laser system according to a second embodiment of the present invention. In FIG. 5, a laser device 110, lens 330, a filament portion 410, and a target 610 have the same functions and configurations as those of the laser device 100, the lens 300, the filament portion 400, and the target 600, respectively. However, a pulse stretcher 230 and a pulse compressor 530 in FIG. 5 have the same functions as but different configurations from the pulse stretcher 200 and the pulse compressor 500 in FIG. 1.

The pulse stretcher 230 and the pulse compressor 530 may be a prism stretcher and a prism compressor, respectively. As an example, the pulse stretcher 230 may include a first half mirror 232, a first prism 234, a second prism 236, and a first mirror 238. The first half mirror 232 may enable a portion of the laser pulse 710 to pass through the first prism 234, and enable a remaining portion of the laser pulse 710 to be reflected to the third mirror 239. Also, the first half mirror 232 may reflect, a laser pulse coming back from the first prism 234, to the third mirror 239. The first prism 234 and the second prism 236 may be arranged between the first half mirror 232 and the first mirror 238. The first prism 234 and the second prism 236 may be arranged to diagonally face each other. The first prism 234 and the second prism 236 may refract the laser pulse 710. The first prism 234 and the second prism 236 may change the propagation path of the laser pulse 710 in opposite directions. For example, when the first prism 234 may propagate a horizontal laser pulse 710 in a downward direction, the second prism 236 may propagate the laser pulse 710 in a horizontal direction. The first prism 236 and the second prism 236 may enable the laser pulse 700 to have negative group delay dispersion. The laser pulse 710 may be reflected from the first mirror 238 to the second prism 236. The laser pulse 710 may be provided to the third mirror 239 and the first mirror via the second prism 236, the first prism 234, and the first half mirror 232. The third mirror 239 may be disposed between the first half mirror 232 and the first lens 332.

The pulse compressor 530 may include a second half mirror 532, a third prism 534, a fourth prism 536, and a second mirror 538. The second half mirror 532 may perform transflection on the laser pulse 710 provided from the second lens 334. The second half mirror 532 may enable a portion of the laser pulse 710 to pass through the third prism 534. The second half mirror 532 may enable a remaining portion of the laser pulse 710 to be reflected to the fourth mirror 539. Also, the second half mirror 532 may reflect, the laser pulse 710 coming back from the third prism 534, to the fourth mirror 539. The third prism 534 and the fourth prism 536 may be arranged at an interval to diagonally face each other. The third prism 534 and the fourth prism 536 may refract the laser pulse 710 in opposite directions. The third prism 534 may propagate a horizontal laser in a downward direction. The fourth prism 536 may propagate the laser pulse 710 in a horizontal direction. The fourth prism 536 may provide the laser pulse 710 to the second mirror 538. The third prism 534 and the fourth prism 536 may decrease the pulse width of the laser pulse 700. The second mirror 538 may reflect the laser pulse 710 to the fourth prism 536. The laser pulse 710 may be propagated to the fourth prism 536, the third prism 534, the second half mirror 532, the fourth mirror 539, and the target 610. The fourth mirror 539 may be disposed between the second half mirror 532 and the target 610.

Figure 6:
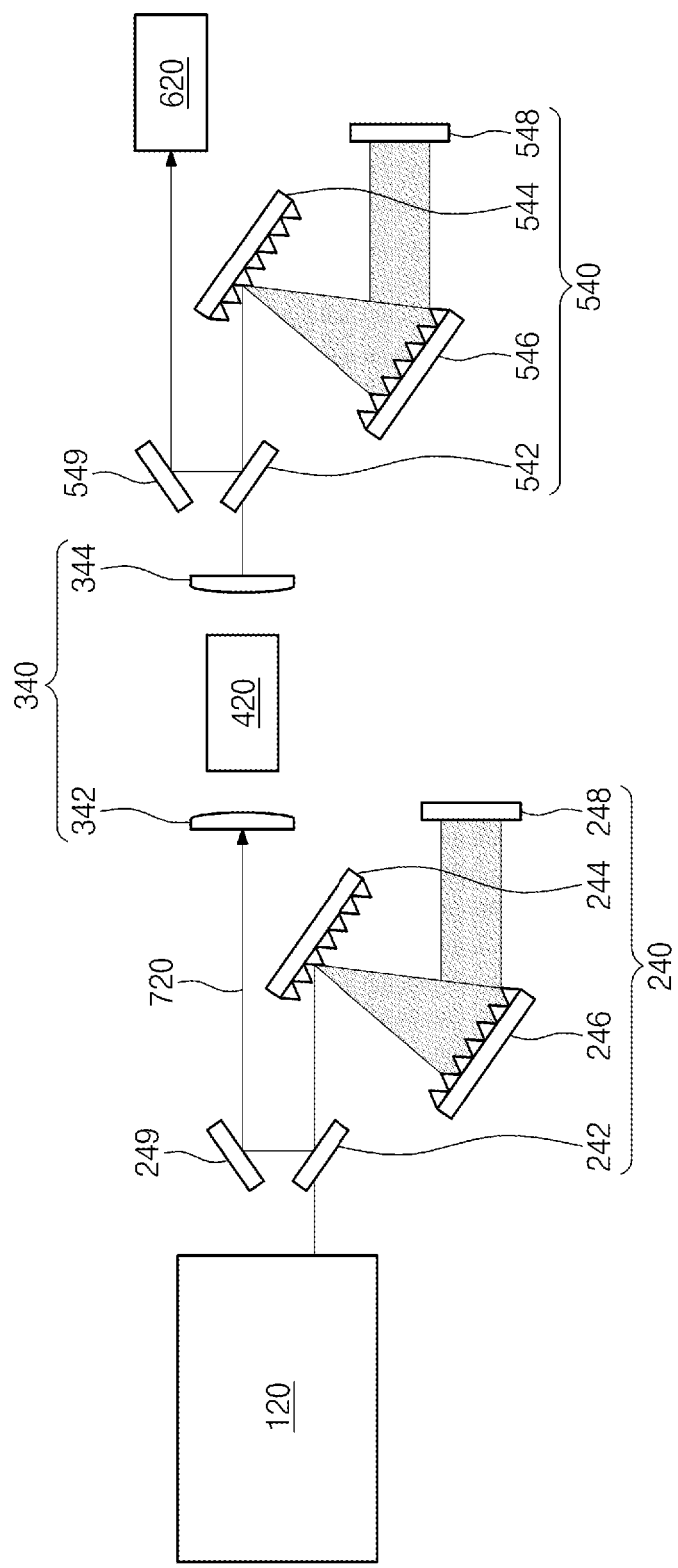
FIG. 6 represents a laser system according to a third embodiment of the present invention.

FIG. 6 shows a laser system according to a third embodiment of the present invention. In FIG. 6, a laser 120, a seventh mirror 249, lens 340, a filament portion 420, an eighth mirror 549, and a target 620 have the same functions as the laser 110, the third mirror 239, the lens 330, the filament portion 410, the fourth mirror 539 and the target 610 in FIG. 5, respectively. A pulse stretcher 240 and a pulse compressor 540 in FIG. 6 have the same functions as but different configurations from the pulse stretcher 230 and the pulse compressor 530 in FIG. 5.

The pulse stretcher 240 and the pulse compressor 540 may be a grating-based stretcher and a grating-based compressor, respectively. As an example, the pulse stretcher 240 may include a third half mirror 242, a first grating 244, a second grating 246, and a fifth mirror 248. The third half mirror 242 may enable a portion of a laser pulse 720 to pass through the first grating 244, and enable a remaining portion of the laser pulse 720 to be reflected to the seventh mirror 249. Also, the third half mirror 242 may reflect, the laser pulse 720 coming back from the first grating 244, to the seventh mirror 249. The first grating 244 and the second grating 246 may be arranged to face each other. The first grating 244 and the second grating 246 may disperse the laser pulse 720. The first grating 244 and the second grating 246 may provide negative group delay dispersion to the laser pulse 720. The second grating 246 may provide the laser pulse 720 to the fifth mirror 248. The fifth mirror 248 may reflect the laser pulse 720 back to the second grating 246. The laser pulse 720 may be propagated to the second grating 246, the first grating 244, the third half mirror 242, and the seventh mirror 249.

The pulse compressor 540 may include a fourth half mirror 542, a third grating 544, a fourth grating 546, and a sixth mirror 548. The fourth half mirror 542 may perform transflection on the laser pulse 720. The fourth half mirror 542 may enable a portion of the laser pulse 720 to pass through the third grating 544. The fourth half mirror 542 may enable a remaining portion of the laser pulse 720 to be reflected to the eighth mirror 549. The fourth half mirror 542 may reflect, the laser pulse 720 coming back from the third grating 544, to the eighth mirror 549. The third grating 544 and the fourth grating 546 may be arranged to face each other. The third grating 544 and the fourth grating 546 may decrease the pulse width of the laser pulse 720. The fourth prism 546 may provide the laser pulse 720 to the sixth mirror 548. The sixth mirror 548 may reflect the laser pulse 720 back to the fourth grating 546. The laser pulse 720 may be propagated to the fourth grating 546, the third grating 544, the fourth half mirror 542, the eighth mirror 549, and the target 620.

Figure 7:
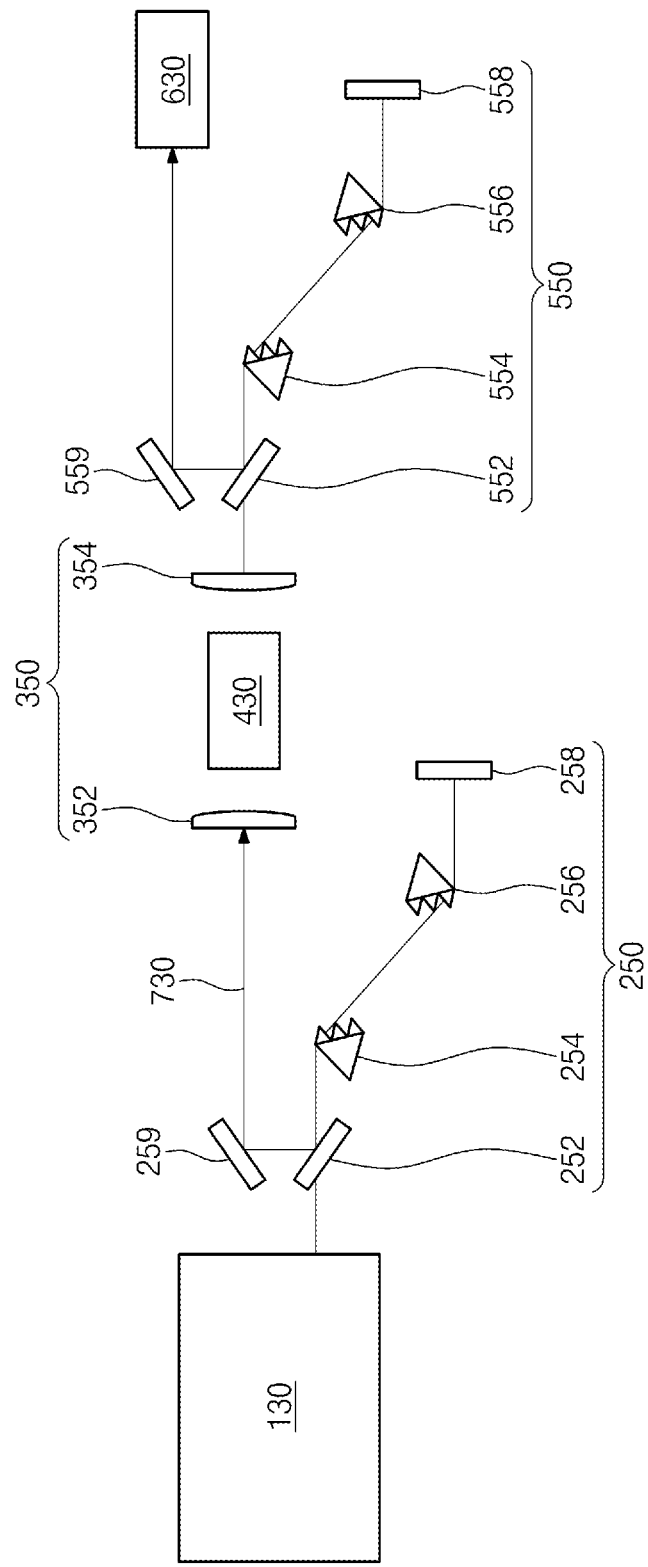
FIG. 7 represents a laser system according to a fourth embodiment of the present invention.

FIG. 7 shows a laser system according to a fourth embodiment of the present invention. In FIG. 6, a laser 130, an eleventh mirror 259, lens 350, a filament portion 430, a twelfth mirror 559, and a target 630 have the same functions and configurations as the laser 120, the seventh mirror 249, the lens 340, the filament portion 420, the eighth mirror 549 and the target 620 in FIG. 5, respectively. However, a pulse stretcher 250 and a pulse compressor 550 in FIG. 7 have the same functions as but different configurations from the pulse stretcher 240 and the pulse compressor 540 in FIG. 6.

The pulse stretcher 250 and the pulse compressor 540 may be a grism stretcher and a grism compressor, respectively. As an example, the pulse stretcher 250 may include a fifth half mirror 252, a first grism 254, a second grism 256, and a ninth mirror 258. The fifth half mirror 252 may enable a portion of a laser pulse 730 to pass through the first grism 254, and enable a remaining portion of the laser pulse 730 to be reflected to the eleventh mirror 259. Also, the fifth half mirror 252 may reflect, the laser pulse 730 coming back from the first grism 254, to the eleventh mirror 259. The first grism 254 and the second grism 256 may be arranged to diagonally face each other. The first grism 254 and the second grism 256 may provide negative group delay dispersion to the laser pulse 730. The second grism 256 may provide the laser pulse 730 to the ninth mirror 258. The ninth mirror 258 may reflect the laser pulse 730 back to the second grism 256. The laser pulse 730 may be propagated to the second grism 256, the first grism 254, the fifth half mirror 252, and the eleventh mirror 259.

The pulse compressor 540 may include a sixth half mirror 552, a third grism 554, a fourth grism 556, and a tenth mirror 558. The sixth half mirror 552 may perform transflection on the laser pulse 730. The sixth half mirror 552 may enable a portion of the laser pulse 730 to pass through the third grism 554. The sixth half mirror 552 may enable a remaining portion of the laser pulse 730 to be reflected to the twelfth mirror 559. The sixth half mirror 552 may reflect, the laser pulse 730 coming back from the third grism 554, to the twelfth mirror 559. The third grism 554 and the fourth grism 556 may be arranged to diagonally face each other. The third grism 554 and the fourth grism 556 may decrease the pulse width of the laser pulse 730. The fourth grism 556 may provide the laser pulse 730 to the tenth mirror 558. The tenth mirror 558 may reflect the laser pulse 730 back to the fourth grism 556. The laser pulse 730 may be propagated to the fourth grism 556, the third grism 554, the sixth half mirror 552, the twelfth mirror 559, and the target 630.

As described above, the laser system according to embodiments of the present invention may include a pulse stretcher, a filament portion, and a pulse compressor. The pulse stretcher may provide a laser pulse having negative group delay dispersion. The laser pulse may be provided to the filament portion. The filament portion may offset the negative group delay dispersion of the laser pulse by positive group delay dispersion thereof. The filament portion may expand the spectrum of the laser pulse. The pulse compressor may maximize the peak intensity of the laser pulse having offset dispersion.

While embodiments of the present invention are described with reference to the accompanying drawings, a person skilled in the art may understand that the present invention may be practiced in other particular forms without changing technical spirits or essential characteristics. Therefore, the above-described embodiments and applications should be understood as illustrative and not limitative in every aspect.

What is claimed is:

1. A laser system comprising:
   a laser device providing a laser pulse;
   a pulse compressor;
   a pulse stretcher disposed between the pulse compressor and the laser device and dispersing the laser pulse provided by the laser device; and
   a filament portion disposed between the pulse stretcher and the pulse compressor,
   wherein the filament portion expands a spectrum of the laser pulse dispersed by the pulse stretcher by using self-focusing and a filament phenomenon of the dispersed laser pulse, the filament portion comprises N-SF11.

2. The laser system of claim 1, further comprising:
   a first lens disposed between the pulse stretcher and the filament portion and focusing the laser pulse dispersed by the pulse stretcher on the filament portion; and
   a second lens disposed between the filament portion and the pulse compressor, the second lens collimating the laser pulse transmitted through the filament portion and providing the collimated laser pulse to the pulse compressor.

3. The laser system of claim 1, wherein the pulse stretcher and the pulse compressor comprise a chirped pulse stretcher and a chirped pulse compressor, respectively.

4. The laser system of claim 3, wherein the chirped pulse stretcher comprises:
   a first chirped mirror reflecting the laser pulse provided by the laser device; and
   a second chirped mirror disposed in parallel to the first chirped mirror, the second chirped mirror reflecting the laser pulse reflected by the first chirped mirror to disperse the laser pulse with a negative dispersion.

5. The laser system of claim 3, wherein the chirped pulse compressor comprises:
   a first chirped mirror reflecting the laser pulse transmitted through the filament portion; and
   a second chirped mirror disposed in parallel to the first chirped mirror, the second chirped mirror reflecting the laser pulse reflected by first chirped mirror to decrease a pulse width of the laser pulse.

6. The laser system of claim 1, wherein the pulse stretcher and the pulse compressor comprise a prism stretcher and a prism compressor, respectively.

7. The laser system of claim 6, wherein the prism stretcher comprises:
   a first half mirror transmitting the laser pulse provided by the laser device;
   a first prism refracting the laser pulse transmitted through the first half mirror;
   a second prism diagonally facing the first prism, the second prism refracting the laser pulse refracted by the first prism to output a laser pulse with a negative dispersion; and
   a first mirror reflecting the laser pulse refracted by the second prism back to the second prism.

8. The laser system of claim 6, wherein the prism compressor comprises:

a first half mirror transmitting the laser pulse transmitted through the filament portion;
a first prism refracting the laser pulse transmitted through the first half mirror;
a second prism diagonally facing the first prism, the second prism refracting the laser pulse refracted by the first prism to decrease a pulse width of the laser pulse refracted by the first prism; and
a first mirror reflecting the laser pulse refracted by the second prism back to the second prism.

9. The laser system of claim 6, further comprising:
a first mirror disposed between the prism stretcher and the filament portion;
a target exposed to a laser pulse provided from the prism compressor; and
a second mirror disposed between the prism compressor and the target.

10. The laser system of claim 1, wherein the pulse stretcher and the pulse compressor comprise a grating-based stretcher and a grating-based compressor, respectively.

11. The laser system of claim 10, wherein the grating-based stretcher comprises:
a first half mirror transmitting the laser pulse provided by the laser device;
a first grating reflecting the laser pulse transmitted through the first half mirror;
a second grating disposed in parallel to the first grating, the second grating reflecting the laser pulse reflected by the first grating to output a laser pulse with a negative dispersion; and
a first mirror reflecting the laser pulse reflected by the second grating back to the second grating.

12. The laser system of claim 10, wherein the grating-based compressor comprises:
a first half mirror transmitting the laser pulse transmitted through the filament portion;
a first grating reflecting the laser pulse transmitted through the first half mirror;
a second grating disposed in parallel to the first grating, the second grating reflecting the laser pulse reflected by the first grating to decrease a pulse width of the laser pulse reflected by the first grating; and
a first mirror reflecting the laser pulse reflected by the second grating back to the second grating.

13. The laser system of claim 10, further comprising:
a first mirror disposed between the grating-based stretcher and the filament portion;
a target exposed to a laser pulse provided from the grating-based compressor; and
a second mirror disposed between the grating-based compressor and the target.

14. A laser system comprising:
a laser device providing a laser pulse;
a pulse compressor;
a pulse stretcher disposed between the pulse compressor and the laser device and dispersing the laser pulse provided by the laser device; and
a filament portion disposed between the pulse stretcher and the pulse compressor,
wherein the filament portion expands a spectrum of the laser pulse dispersed by the pulse stretcher by using self-focusing and a filament phenomenon of the dispersed laser pulse,
wherein the pulse stretcher and the pulse compressor comprise a grism stretcher and a grism compressor, respectively, and wherein the grism stretcher comprises:
a first half mirror transmitting the laser pulse provided by the laser device;
a first grism refracting the laser pulse transmitted through the first half mirror;
a second grism diagonally facing the first grism, the second grism refracting the laser pulse refracted by the first grism to output a laser pulse with a negative dispersion; and
a first mirror reflecting the laser pulse refracted by the second grism back to the second grism.

15. The laser system of claim 14, further comprising:
a second mirror disposed between the grism stretcher and the filament portion;
a target exposed to a laser pulse provided from the grism compressor; and
a third mirror disposed between the grism compressor and the target.

16. The laser system of claim 14, wherein the grism compressor comprises:
a second half mirror transmitting the laser pulse transmitted through the filament portion;
a third grism refracting the laser pulse transmitted through the second half mirror;
a fourth grism diagonally facing the third grism, the fourth grism refracting the laser pulse refracted by the third grism to decrease a pulse width of the laser pulse refracted by the third grism; and
a second mirror reflecting the laser pulse refracted by the fourth grism back to the fourth grism.

17. A laser system comprising:
a laser device providing a laser pulse;
a pulse compressor;
a pulse stretcher disposed between the pulse compressor and the laser device and dispersing the laser pulse provided by the laser device; and
a filament portion disposed between the pulse stretcher and the pulse compressor,
wherein the filament portion expands a spectrum of the laser pulse dispersed by the pulse stretcher by using self-focusing and a filament phenomenon of the dispersed laser pulse,
wherein the pulse stretcher and the pulse compressor comprise a grism stretcher and a grism compressor, respectively, and
wherein the grism compressor comprises:
a first half mirror transmitting the laser pulse transmitted through the filament portion;
a first grism refracting the laser pulse transmitted through the first half mirror;
a second grism diagonally facing the first grism, the second grism refracting the laser pulse refracted by the first grism to decrease a pulse width of the laser pulse refracted by the first grism; and
a first mirror reflecting the laser pulse refracted by the second grism back to the second grism.

18. The laser system of claim 17, further comprising:
a second mirror disposed between the grism stretcher and the filament portion;
a target exposed to a laser pulse provided from the grism compressor; and
a third mirror disposed between the grism compressor and the target.

* * * * *